United States Patent
Jebali

(10) Patent No.: US 10,379,304 B2
(45) Date of Patent: Aug. 13, 2019

(54) OPTICAL FIBER TEMPERATURE CONTROL SYSTEM AND METHOD

(71) Applicant: AFL Telecommunications LLC, Duncan, SC (US)

(72) Inventor: Mohamed Amine Jebali, Greer, SC (US)

(73) Assignee: AFL Telecommunications LLC, Duncan, SC (US)

( * ) Notice: Subject to any disclaimer, the term of this patent is extended or adjusted under 35 U.S.C. 154(b) by 116 days.

(21) Appl. No.: 15/631,505

(22) Filed: Jun. 23, 2017

(65) Prior Publication Data

US 2017/0371117 A1  Dec. 28, 2017

Related U.S. Application Data

(60) Provisional application No. 62/354,442, filed on Jun. 24, 2016, provisional application No. 62/451,811, filed on Jan. 30, 2017.

(51) Int. Cl.

| G01B 9/02  | (2006.01) |
|---|---|
| G01J 5/00  | (2006.01) |
| G02B 6/12  | (2006.01) |
| G02B 6/42  | (2006.01) |
| G01R 19/32 | (2006.01) |
| G05D 23/02 | (2006.01) |
| G05D 23/27 | (2006.01) |

(52) U.S. Cl.
CPC ....... *G02B 6/4266* (2013.01); *G01B 9/02001* (2013.01); *G01J 5/0003* (2013.01); *G01R 19/32* (2013.01); *G02B 6/12026* (2013.01); *G02B 6/4296* (2013.01); *G05D 23/02* (2013.01); *G05D 23/27* (2013.01); *G02B 2006/12135* (2013.01)

(58) Field of Classification Search
CPC .............. G02B 6/4266; G02B 6/12026; G02B 6/4296; G01B 9/02001; G01J 5/0003; G01R 19/32
See application file for complete search history.

(56) References Cited

U.S. PATENT DOCUMENTS

| 3,454,769 | A | * | 7/1969 | Dynes | ........................ G01J 5/60 |
|---|---|---|---|---|---|
| | | | | | 250/214 SG |
| 3,456,061 | A | * | 7/1969 | Hoff | .................... G05D 23/1906 |
| | | | | | 219/667 |
| 2009/0244691 | A1 | * | 10/2009 | Mueller | ............... B23K 26/067 |
| | | | | | 359/307 |
| 2013/0222560 | A1 | * | 8/2013 | Nakamura | ........... A61B 5/0059 |
| | | | | | 348/61 |

FOREIGN PATENT DOCUMENTS

WO    WO-2014004832 A2 *  1/2014  .......... G02B 6/2551

* cited by examiner

*Primary Examiner* — David P Porta
*Assistant Examiner* — Jeremy S Valentiner
(74) *Attorney, Agent, or Firm* — Dority & Manning, P.A.

(57) ABSTRACT

A method for monitoring optical fiber temperature includes heating an optical fiber using a heat source, and measuring an infrared radiation level emitted by an optical fiber during heating of the optical fiber. The method further includes comparing the infrared radiation level to a radiation level setpoint for the optical fiber to determine a radiation level error value. The method further includes adjusting a power level setpoint of the heat source based on the radiation level error value.

19 Claims, 3 Drawing Sheets

OPTICAL FIBER TEMPERATURE CONTROL SYSTEM AND METHOD

PRIORITY STATEMENT

The present application claims priority to U.S. Provisional Patent Application Ser. No. 62/354,442, filed Jun. 24, 2016 and to U.S. Provisional Patent Application Ser. No. 62/451,811, filed Jan. 30, 2017, both of which are incorporated by reference herein in their entireties.

FIELD

The present disclosure relates generally to systems and methods for controlling the temperature of optical fibers during heating thereof.

BACKGROUND

Advances in fiber and glass processing technology have been driven by a demand for high quality optical fiber components for a variety of applications. For example, in recent years, $CO_2$ laser-based glass processing machines played a key role in enabling a new generation of all-fiber optical components like ball lenses and tapered axicons, as well as simplifying the fabrication process of many other components like long period gratings, multimode and single mode signal and pump combiners, etc.

The control of the glass temperature is one of the most important parameters in order to achieve a controlled and repeatable glass shaping process. Current technology for sensing the fiber temperature relies on using charge coupled device ("CCD") cameras for the detection of the visible emission of the heated optical fiber. To implement this method, a complex image processing algorithm is used to estimate the brightness of the fiber being melted. This method has two major weaknesses. Its first weakness is its speed and computing resource consumption. Because of the complexity of the algorithms, the low speed of this method limits the response time of the system. The second weakness of this method is that it can only detect high melting temperatures, when fiber emits visible light. This method cannot be used with low melting point fibers.

Accordingly, improved systems and methods for controlling the temperature of optical fibers during heating thereof are desired.

BRIEF DESCRIPTION

Aspects and advantages of the invention will be set forth in part in the following description, or may be obvious from the description, or may be learned through practice of the invention.

In accordance with one embodiment, the present disclosure is directed to a method for monitoring optical fiber temperature. The method includes heating an optical fiber using a heat source, and measuring an infrared radiation level emitted by an optical fiber during heating of the optical fiber. The method further includes comparing the infrared radiation level to a radiation level setpoint for the optical fiber to determine a radiation level error value. The method further includes adjusting a power level setpoint of the heat source based on the radiation level error value.

In accordance with another embodiment, the present disclosure is directed to an optical fiber temperature control system. The control system includes a heat source operable to emit a heating element, and an infrared sensor operable to measure an infrared radiation level emitted by the optical fiber during heating of the optical fiber by the heating element. The control system further includes a controller in operable communication with the infrared sensor and the heat source. The controller is configured for comparing the infrared radiation level to a radiation level setpoint for the optical fiber to determine a radiation level error value. The controller is further configured for adjusting a power level setpoint of the heat source based on the radiation level error value.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION

A full and enabling disclosure of the present invention, including the best mode thereof, directed to one of ordinary skill in the art, is set forth in the specification, which makes reference to the appended figures, in which.

Figure 5:
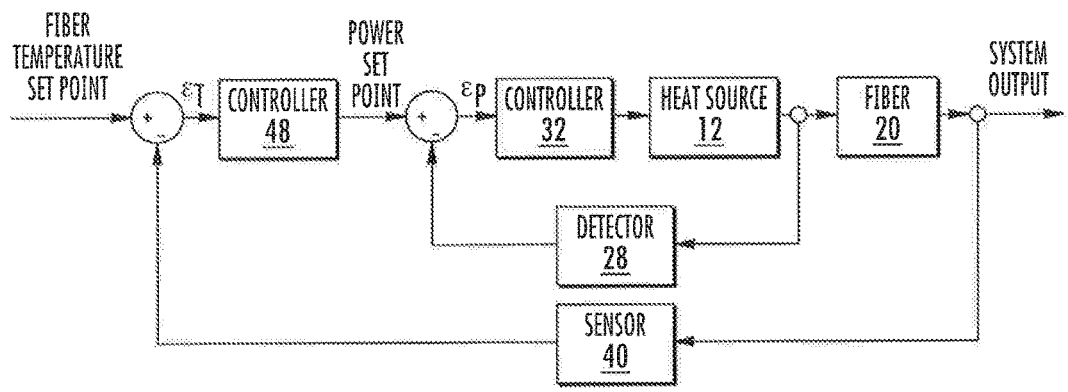
Figure 6:
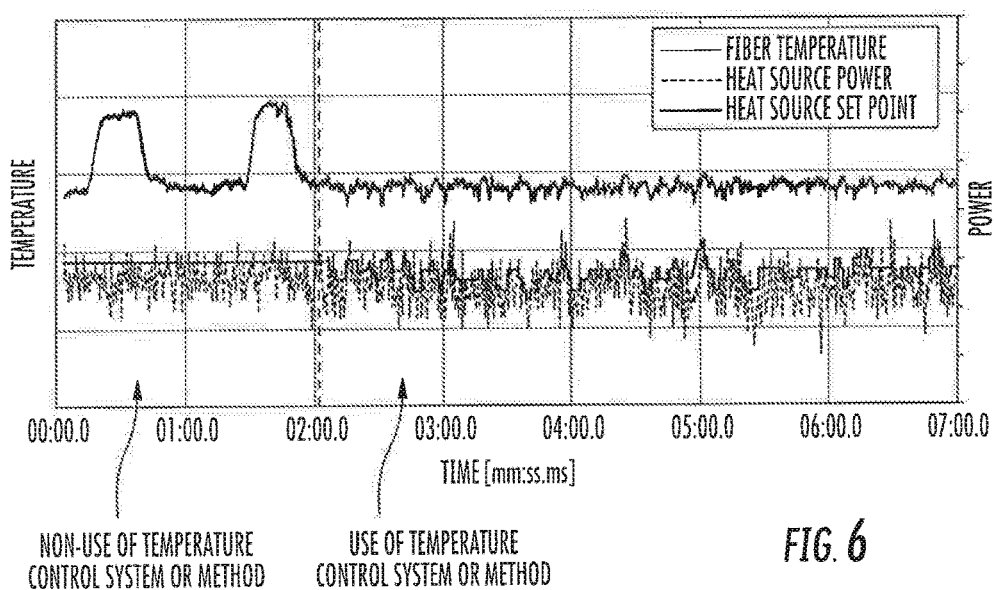

FIG. 5 provides a block diagram illustrating operation of an optical fiber temperature control system and a method for monitoring optical fiber temperature in accordance with embodiments of the present disclosure; and FIG. 6 is a graph illustrating fiber temperature, laser power, and laser power set point over time during non-use and use of an optical fiber temperature control system and a method for monitoring optical fiber temperature in accordance with embodiments of the present disclosure.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present disclosure is directed to optical fiber temperature control systems and methods for monitoring optical fiber temperatures. Such systems and methods advantageously monitor the infrared radiation being emitted by an optical fiber during heating thereof, and adjust the power level (via adjustment of the power level setpoint) of the heat source heating the optical fiber. In exemplary embodiments, such monitoring and adjusting are utilized in conjunction with additional monitoring of the heat source power level and adjustment of the power level. In exemplary embodiments, systems and methods in accordance with the present disclosure advantageously allow for stabilization of the heat source average output power to within +/−0.5%. Such systems and methods are particularly advantageous for use with specialty fibers made from low melting point glass, although the use of such systems and methods is not so limited.

Figure 1:
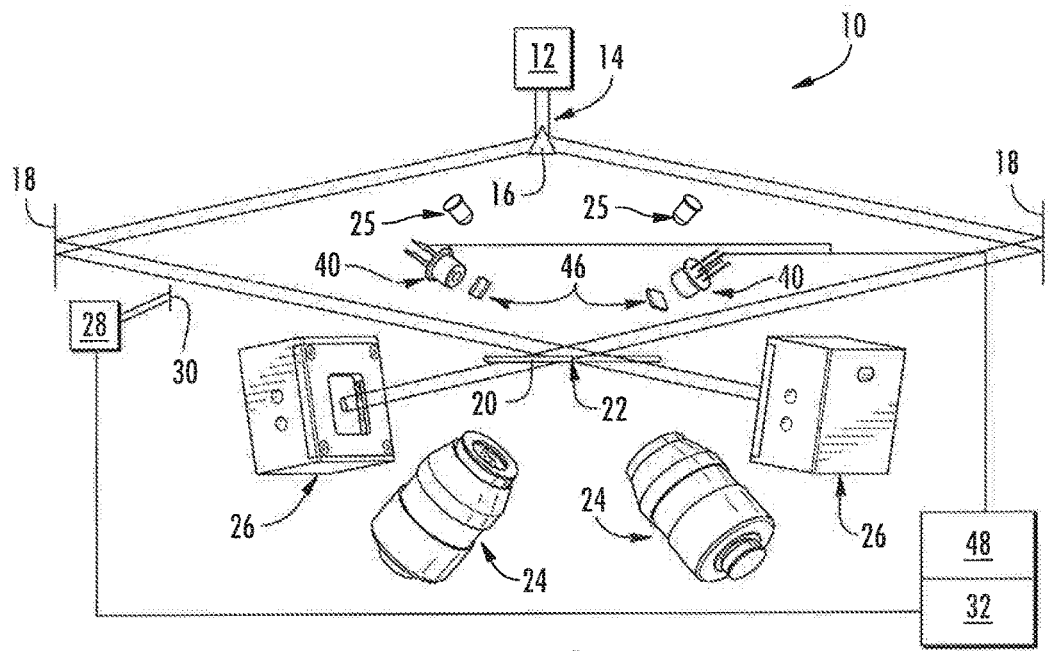
FIG. 1 illustrates an optical fiber temperature control system in accordance with embodiments of the present disclosure.
Figure 2:
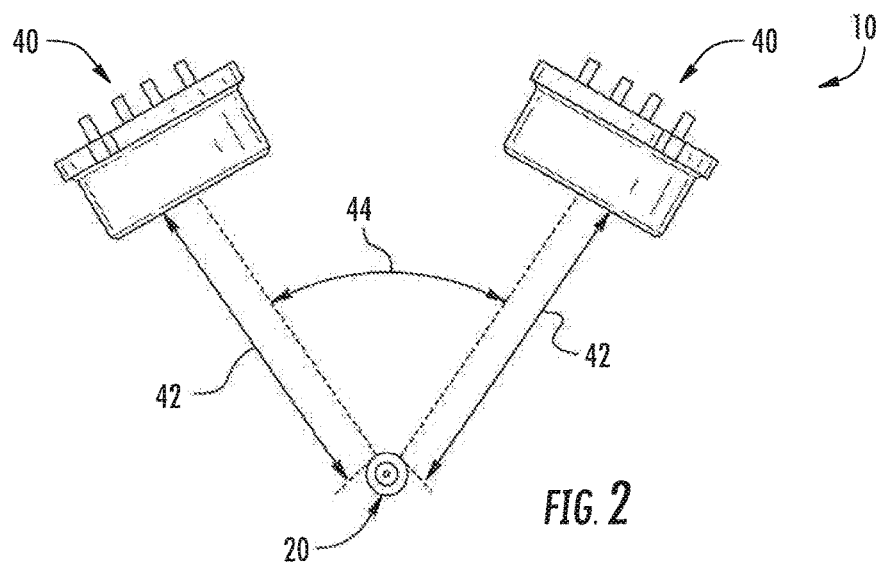
FIG. 2 illustrates components of an optical fiber temperature control system in accordance with embodiments of the present disclosure.

Referring now to FIGS. 1 and 2, embodiments of an optical fiber temperature control system 10 in accordance with the present disclosure are provided. As shown, system 10 includes a heat source 12 which emits a heating element 14. In exemplary embodiments, the heat source 12 is a laser which emits a laser beam. For example, in particular exemplary embodiments, the heat source 12 is a $CO_2$ laser which emits a $CO_2$ laser beam. Alternatively, however, heat source 12 could be an electrical source which generates an electric arc, or may be another suitable heat source. In exemplary embodiments, such heat source 12 (and control system 10 generally) may be components of a fiber optic splicer, welder, etc.

System 10 may, in some embodiments and in particular when lasers are utilized, further include a splitter 16, which may split the heating element 14 into multiple heating elements. System 10 may further include one or more mirrors 18 which direct the heating elements 14.

As shown, the heating element(s) 14 may contact and heat an optical fiber 20 at a heating location 22 on the optical fiber 20. Such location may, for example, be a discrete portion along the length of the optical fiber 20. In some embodiments, system 10 may further include one or more CCD cameras 24 and one or more moving stages on which the optical fiber 20 may be mounted. The CCD cameras 24 may receive images of the position of the optical fiber 20 (and heating location 22 thereof) relative to the heating element(s) 14, and may position the optical fiber 20 in the path of the heating element(s) 14 along one or more axes to facilitate heating of the optical fiber 20. Additionally, one or more light emitting diodes ("LEDs") 25 may be provided in the system 10 to illuminate the optical fiber 20 for positioning and other purposes.

In some embodiments, system 10 may further include one or more thermopiles 26. Thermopiles 26 may be positioned to received portions of the heating element(s) 14 not absorbed by the optical fiber 20 during heating thereof. Thermopiles 26 can further be utilized to measure heat source 12 power and heating element position based on the received heating element(s) 14.

As discussed, in exemplary embodiments, the heat source 12 is a laser and the heating element 14 is a laser beam. Further, in some embodiments, optical fiber 20 may absorb 10.6 micrometer radiation from the laser beam. Alternatively, optical fiber 20 may absorb radiation between 5 micrometers and 12 micrometers, or at other suitable wavelength levels.

System 10 may further include a detector (also known as a beam sampler) 28. The detector 28, i.e. an infrared detector 28, may be positioned to detect a power level of the heat source 12. For example, detector 28 may be positioned to detect a portion of the heating element for purposes of measuring a power level of the heat source 12. In some embodiments, for example, system 10 may further include a sampling mirror 30. The emitted heating element 14 (which as discussed is in exemplary embodiments a laser beam) may, before encountering the optical fiber 20, encounter the sampling mirror 30, such as a surface thereof. The sampling mirror 30 may be formed from a partially reflective material, and thus be partially reflective such that a portion of the heating element 14 is transmitted through the sampling mirror 30 and a portion of the heating element 14 is reflected by the sampling mirror 30. For example, in exemplary embodiments, the sampling mirror 30 may be formed from zinc selenide. Alternatively, other suitable materials from which the sampling mirror 30 may be formed include zinc sulfide, germanium, and gallium arsenide.

In exemplary embodiments, the sampling mirror 30 is less than or equal to 1% transmissive, such as less than or equal to 0.7% transmissive, such as less than or equal to 0.5% transmissive, at a particular heating element 14 wavelength being utilized and monitored. In exemplary embodiments, the particular heating element wavelength is between 5 and 12 micrometers, such as between 10 and 11 micrometers, such as between 10.3 and 10.8 micrometers, such as 10.6 micrometers. A sampling mirror 30 having a particular transmissivity allows the specified percentage of heating element to be transmitted therethrough, and reflects the remainder of the heating element 14, as is generally understood.

A portion of the heating element 14 may, upon encountering and thus contacting a surface of the sampling mirror 30, be transmitted through the sampling mirror 30. This portion may, upon being emitted from the sampling mirror 30, be transmitted from the sampling mirror 30 to the detector 28. The detector 28 may be positioned to detect this portion that is transmitted through the sampling mirror 30.

Advantageously, the portion of the heating element 14 can be utilized to monitor the power lever of the heat source 12 and facilitate adjustments as required to maintain a net output power level with minimal fluctuations. For example, in some embodiments, the control system 10 may further include a controller 32 (which may be referred to as a second controller herein). The controller 32 may be in operable communication with the detector 28 and the heat source 12, and may be configured to adjust the power level of the heat source 12 based on the input signals from the detector 28. The input signals may be based on the portion of the heating element 14 received by the detector 28.

For example, the controller 32 may compare the power level of the heat source 12 (which may be based on the input signals from the detector 28) to a power level setpoint. Such setpoint may be a power level at which it is desired that the heat source 12 is maintained. Such setpoint may, for example, be programmed into the controller 32. By comparing the power level to the power level setpoint, a power level error value may be determined. Such error value may, for example, be a difference between the power level and the power level setpoint. Controller 32 may further adjust the power level of the heat source 12 based on the power level error value. Such adjustment may increase or decrease the power level to bring the power level to the power level setpoint.

In exemplary embodiments, adjusting the power level of the heat source 12 may include adjusting a pulse width modulation signal being utilized by the heat source 12. For example, in exemplary embodiments, the controller 32 may for example adjust the pulse width modulation signal and transmit the adjusted pulse width modulation signal to the heat source 12.

The controller 32 may include a memory and microprocessor, such as a general or special purpose microprocessor operable to execute programming instructions or microcontrol code associated with processing of signals from the detector 28. The memory may represent random access memory such as DRAM, or read only memory such as ROM or FLASH. In one embodiment, the processor executes programming instructions stored in memory. The memory may be a separate component from the processor or may be included onboard within the processor.

As discussed, a portion of the heating element 14 is transmitted to a detector. Further, another separate portion of the heating element 14 may proceed to encounter the optical fiber 20. For example, the other separate portion of the heating element 14 may encounter the sampling mirror 30 and may be reflected by the sampling mirror 30. Accordingly, a substantial portion of the heating element 14 can continue to the optical fiber 20.

System 10 may further include one or more infrared sensors 40. Each infrared sensor 40 may be positioned and operable to measure an infrared radiation level emitted by the optical fiber 20 (such as the heating portion 22 thereof) during heating of the optical fiber 20 by the heating element 14. Sensors 40 may be spaced from the optical fiber 20 (such as the heating portion 22 thereof) by a suitable distance 42 to obtain suitable infrared measurements, such as between 20 and 30 millimeters from a central longitudinal axis of the optical fiber 20, such as between 22 and 28 millimeters from the central longitudinal axis, such as 25 millimeters from the central longitudinal axis. Further, in embodiments wherein multiple sensors 40 are utilized, an angle 44 (about the central longitudinal axis of the optical fiber 20) may be between 80 and 100 degrees, such as between 85 and 95 degrees, such as 90 degrees.

Infrared sensor(s) 40 may measure infrared radiation levels being emitted by the optical fiber 20, such as the heating portion 22 thereof. Further, in exemplary embodiments, one or more filters 46 may be provided. Filters 46 may be positioned to filter infrared radiation being emitted by the optical fiber 20, such as the heating portion 22 thereof, before such infrared radiation is sensed and measured by the sensors 40. Accordingly, a filter 46 may be positioned between a sensor 40 and the optical fiber 20.

Figure 3:
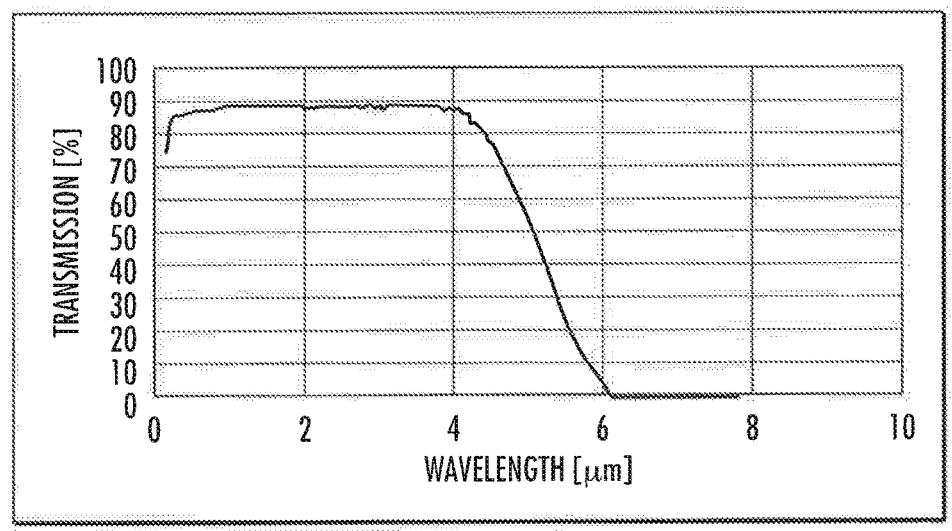
FIG. 3 is a graph illustrating transmission at various wavelengths of a filter in accordance with embodiments of the present disclosure.

Each filter 46 may allow certain wavelengths to be transmitted therethrough (for sensing and measuring by a sensor 40), and may block or restrict other wavelengths from being transmitted therethrough. For example, in exemplary embodiments, a filter 46 may be greater than 80% transmissive for wavelengths between 0.5 micrometers and 4 micrometers. Further, in exemplary embodiments, a filter 46 may be is less than or equal to 1% transmissive at wavelengths greater than 3 micrometers, such as greater than 4 micrometers, such as greater than 6 micrometers, such as at wavelengths greater than 6.5 micrometers, such as at wavelengths greater than 9 micrometers. In some exemplary embodiments, the filter 46 is less than or equal 1% transmissive at wavelengths between 9 micrometers and 11 micrometers, such as between 9.3 micrometers and 10.6 micrometers. In some embodiments, a filter 46 is a bandpass filter which targets a specific wavelength range, such as those described herein. FIG. 3 illustrates one embodiment of the transmission levels at various wavelengths of a filter 46.

Figure 4:
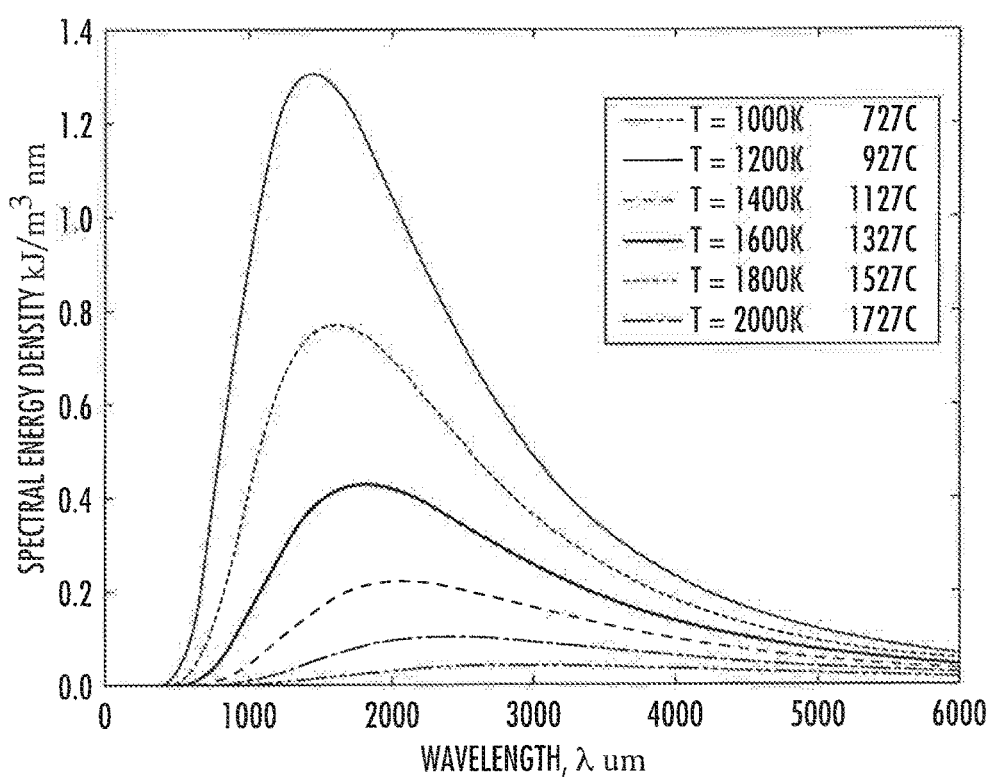
FIG. 4 is a graph illustrating peak wavelength and total radiated power from a heated fiber as a function of temperature in accordance with embodiments of the present disclosure.

Advantageously, the infrared radiation levels received by the sensors 40 can be utilized to monitor the optical fiber 20 temperature. For example, FIG. 4 illustrates the correlation between temperature (such as of the heating portion 22 of an optical fiber) and infrared radiation levels at various wavelengths. Such monitoring can further facilitate adjustments as required to maintain a relatively constant temperature level of the heating portion 22 with minimal fluctuations. For example, in some embodiments, the control system 10 may further include a controller 48 (which may be referred to as a first controller herein). The controller 48 may be in operable communication with the sensor(s) 40 and the heat source 12, and may be configured to adjust the power level setpoint of the heat source 12 based on input signals from the sensors 40. The input signals may be based on infrared radiation received by the sensors 40, which corresponds to the temperature of the optical fiber 20 and heating portion 22 thereof.

For example, the controller 48 may compare the infrared radiation level (received by the sensors 40 and transmitted to the controller 48) to a radiation level setpoint. Such setpoint may be a radiation level (and thus a temperature) at which it is desired that the optical fiber 20 is maintained. Such setpoint may, for example, be programmed into the controller 48. By comparing the infrared radiation level to the radiation level setpoint, a radiation level error value may be determined. Such error value may, for example, be a difference between the infrared radiation level and the radiation level setpoint. Controller 48 may further adjust the power level setpoint of the heat source 12 based on the radiation level error value. Such adjustment may increase or decrease the power level setpoint, such that the power level is adjusted to increase or decrease the radiation level and thus the temperature of the optical fiber, bringing the radiation level to the radiation level setpoint.

The controller 48 may include a memory and microprocessor, such as a general or special purpose microprocessor operable to execute programming instructions or microcontrol code associated with processing of signals from the sensor(s) 40. The memory may represent random access memory such as DRAM, or read only memory such as ROM or FLASH. In one embodiment, the processor executes programming instructions stored in memory. The memory may be a separate component from the processor or may be included onboard within the processor.

In exemplary embodiments, controller 32 and controller 48 are portions or sub-units of the same controller which is generally configured to perform the operations of both controller 32 and 48. Alternatively, controller 32 and 48 may be separate, stand-alone controllers.

FIG. 5 is a block diagram illustrating operation of optical fiber temperature control systems 10 and method for monitoring optical fiber temperatures in accordance with embodiments of the present disclosure. As shown, and in exemplary embodiments, operation of the control system 10 is generally as a closed-loop feedback system. In exemplary embodiments, two separate loops, one during which heat source 12 power is measured and the other during which optical fiber 20 temperature is measured, are provided. Accordingly, after adjustment as discussed herein, further measurement and adjustment via one or both loops is performed in a closed-loop manner.

As discussed, the present disclosure is further directed to methods for monitoring optical fibers. Such methods may, in exemplary embodiments, be performed by one or more of the various components as discussed above, including controllers 32 and/or 48, heat source 12, sensors 40, filters 46, detector 28, etc.

A method may include, for example, heating an optical fiber 20 using a heat source 12, as discussed herein. The method may, in some embodiments, further include filtering infrared radiation being emitted by the optical fiber 20 during heating of the optical fiber 20, as discussed herein. The method may, in some embodiments, further include measuring an infrared radiation level emitted by the optical fiber 20 during heating of the optical fiber 20, as discussed herein. The method may, in some embodiments, further include comparing the infrared radiation level to a radiation level setpoint for the optical fiber 20 to determine a radiation level error value, as discussed herein. The method may, in some embodiments, further include adjusting a power level setpoint of the heat source 12 based on the radiation level error value, as discussed herein.

Further, the method may, in some embodiments, include measuring a power level of the heat source 12, as discussed herein. The method may, in some embodiments, further include comparing the power level to the power level setpoint to determine a power level error value. The method may, in some embodiments, further include adjusting the power level of the heat source 12 based on the power level error value.

FIG. 6 is a graph illustrating fiber temperature, laser power, and laser power set point over time during non-use and use of an optical fiber temperature control system 10 and method for monitoring optical fiber temperature in accordance with embodiments of the present disclosure. As shown, use of such systems 10 and methods significantly reduces fluctuations and increases consistency in optical fiber 20 temperature during heating of an optical fiber 20.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for monitoring optical fiber temperature, the method comprising:
   receiving an image of a position of an optical fiber with a camera;
   positioning the optical fiber based on the received image;
   emitting a heating element from a heat source;
   splitting the heating element into a first heating element and a second heating element with a splitter;
   directing the first heating element to a heating portion of the optical fiber with a first mirror;
   directing the second heating element to the heating portion of the optical fiber with a second mirror;
   heating the heating portion of the optical fiber using the first heating element directed by the first mirror and the second heating element directed by the second mirror;
   measuring, with an infrared sensor, an infrared radiation level emitted by the optical fiber during heating the heating portion of the optical fiber;
   comparing the measured infrared radiation level to a radiation level setpoint for the optical fiber to determine a radiation level error value based on a difference between the measured infrared radiation level and the radiation level setpoint; and
   adjusting a power level setpoint of the heat source based on the radiation level error value, whereby the infrared radiation level is brought to the radiation level setpoint.

2. The method of claim 1, wherein the heat source is a laser and the heating element is a laser beam emitted by the laser.

3. The method of claim 2, wherein the laser is a carbon dioxide ($CO_2$) laser.

4. The method of claim 1, further comprising, before the measuring step, filtering the infrared radiation level.

5. The method of claim 4, wherein the filter is greater than 80% transmissive for wavelengths between 0.5 micrometers and 4 micrometers.

6. The method of claim 4, wherein the filter is less than or equal to 1% transmissive at wavelengths greater than 6 micrometers.

7. The method of claim 1, further comprising:
   measuring a power level of the heat source with an infrared detector;
   comparing the measured power level to the power level setpoint to determine a power level error value based on a difference between the measured power level and the power level setpoint; and
   adjusting the power level of the heat source based on the power level error value, whereby the power level is brought to the power level setpoint.

8. The method of claim 1, wherein adjusting the power level of the heat source comprises adjusting a pulse width modulation signal being utilized by the heat source.

9. An optical fiber temperature control system, comprising:
   a camera configured to receive an image of a position of an optical fiber;
   a heat source operable to emit a heating element towards a splitter, the splitter configured to split the heating element into a first heating element and a second heating element;
   a first mirror positioned to direct the first heating element to a heating portion of the optical fiber;
   a second mirror positioned to direct the second heating element to the heating portion of the optical fiber;
   an infrared sensor operable to measure an infrared radiation level emitted by the heating portion of the optical fiber during heating of the optical fiber by the first heating element and the second heating element; and
   a controller in operable communication with the camera, a moving stage on which the optical fiber is mounted, the infrared sensor and the heat source, the controller configured for:
      positioning the optical fiber based on the image of the position of the optical fiber;
      comparing the infrared radiation level measured by the infrared sensor to a radiation level setpoint for the optical fiber to determine a radiation level error value based on a difference between the infrared radiation level and the radiation level setpoint; and
      adjusting a power level setpoint of the heat source based on the radiation level error value, whereby the infrared radiation level is brought to the radiation level setpoint.

10. The control system of claim 9, wherein the heat source is a laser and the heating element is a laser beam.

11. The control system of claim 10, wherein the laser is a carbon dioxide ($CO_2$) laser.

12. The control system of claim 10, further comprising a filter.

13. The control system of claim 12, wherein the filter is greater than 80% transmissive for wavelengths between 0.5 micrometers and 4 micrometers.

14. The control system of claim 12, wherein the filter is less than or equal to 1% transmissive at wavelengths greater than 6 micrometers.

15. The control system of claim 10, further comprising a detector positioned to detect a power level of the heat source.

16. The control system of claim 15, wherein the controller is a first controller, and further comprising a second controller in operable communication with the detector and the heat source, the second controller configured for:
   comparing the power level detected by the detector to the power level setpoint to determine a power level error value based on a difference between the detected power level and the power level setpoint; and
   adjusting the power level of the heat source based on the power level error value, whereby the power level is brought to the power level setpoint.

17. The control system of claim 16, wherein adjusting the power level of the heat source comprises adjusting a pulse width modulation signal being utilized by the heat source.

18. The control system of claim 9, further comprising a charge coupled device (CCD) camera.

19. The control system of claim 9, further comprising a thermopile.

\* \* \* \* \*